(12) United States Patent
Yan et al.

(10) Patent No.: US 12,147,156 B2
(45) Date of Patent: Nov. 19, 2024

(54) METHOD OF FABRICATING A SEMICONDUCTOR LAYOUT AND A SEMICONDUCTOR STRUCTURE

(71) Applicant: Fujian Jinhua Integrated Circuit Co., Ltd., Quanzhou (CN)

(72) Inventors: Yifei Yan, Quanzhou (CN); Wenzhang Li, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 478 days.

(21) Appl. No.: 17/555,532

(22) Filed: Dec. 20, 2021

(65) Prior Publication Data

US 2023/0138898 A1   May 4, 2023

(30) Foreign Application Priority Data

Nov. 3, 2021   (CN) .......................... 202111294841.4

(51) Int. Cl.
*G03F 1/36*        (2012.01)
*G06F 30/392*      (2020.01)
(Continued)

(52) U.S. Cl.
CPC .............. *G03F 1/36* (2013.01); *G06F 30/392* (2020.01); *H01L 21/31144* (2013.01); *H01L 21/32139* (2013.01)

(58) Field of Classification Search
CPC .......... G03F 1/36; G03F 1/70; G03F 7/70441; G06F 30/392; G06F 30/398;
(Continued)

(56) References Cited

U.S. PATENT DOCUMENTS 7,794,920 B2    9/2010   Choi
8,921,016 B1 *  12/2014  Kallingal .................. G03F 1/70
                                                     716/54
(Continued)

OTHER PUBLICATIONS

Lin, the specification, including the claims, and drawings in the U.S. Appl. No. 18/603,246 , filed Mar. 13, 2024.
(Continued)

*Primary Examiner* — Nha T Nguyen
(74) *Attorney, Agent, or Firm* — Winston Hsu

(57) ABSTRACT

The present disclosure discloses a method of fabricating a semiconductor layout comprising the following steps. A layout is provided, and the layout includes a plurality of connection patterns. The connection patterns are decomposed to a plurality of first connection patterns and a plurality of second connection patterns alternatively arranged with each other. An optical proximity correction process is performed on the first connection patterns and the second connection patterns to form a plurality of third connection patterns and a plurality of fourth connection patterns, wherein at least a portion of the third connection patterns is overlapped with the fourth connection patterns. The third connection patterns and the fourth connection patterns are outputted to form photomasks. Accordingly, the quality of the photomask may be improved, and the photomask may therefore include more accurate patterns and contours. The present disclosure also provides a method of fabricating a semiconductor structure.

15 Claims, 14 Drawing Sheets

(51) Int. Cl.
*H01L 21/311* (2006.01)
*H01L 21/3213* (2006.01)

(58) Field of Classification Search
CPC ......... H01L 21/31144; H01L 21/32139; H01L 21/76816; H01L 23/522; H01L 21/76838; H01L 23/528; H01L 27/0207
See application file for complete search history.

(56) References Cited

U.S. PATENT DOCUMENTS

| | | | | |
|---|---|---|---|---|
| 9,147,035 | B1* | 9/2015 | Huang | G06F 30/398 |
| 9,477,804 | B2* | 10/2016 | Su | G06F 30/398 |
| 9,785,046 | B2* | 10/2017 | Hsieh | G03F 1/84 |
| 2008/0010628 | A1* | 1/2008 | Jung | G03F 1/36 |
| | | | | 716/55 |
| 2008/0222587 | A1* | 9/2008 | Smayling | G06F 30/394 |
| | | | | 716/125 |
| 2009/0298205 | A1* | 12/2009 | Nagahara | G03F 1/70 |
| | | | | 257/E21.53 |
| 2013/0024824 | A1* | 1/2013 | Huang | G03F 1/36 |
| | | | | 716/53 |
| 2013/0219347 | A1* | 8/2013 | Zou | G03F 1/70 |
| | | | | 716/52 |
| 2013/0232456 | A1* | 9/2013 | Kallingal | G03F 1/36 |
| | | | | 716/53 |
| 2013/0328155 | A1* | 12/2013 | Konomi | G03F 1/38 |
| | | | | 257/E21.258 |
| 2016/0147140 | A1* | 5/2016 | Hsieh | G03F 1/70 |
| | | | | 438/8 |
| 2016/0188781 | A1* | 6/2016 | Hamouda | G03F 1/70 |
| | | | | 716/53 |
| 2018/0144082 | A1* | 5/2018 | Hanchinal | G03F 1/36 |
| 2018/0341736 | A1* | 11/2018 | Chen | G03F 1/36 |
| 2019/0034577 | A1* | 1/2019 | Wang | G03F 1/70 |
| 2019/0067292 | A1 | 2/2019 | Feng | |
| 2020/0118812 | A1 | 4/2020 | Chang | |
| 2020/0321215 | A1* | 10/2020 | Fan | H01L 21/0332 |
| 2022/0373877 | A1* | 11/2022 | Yang | G03F 7/70516 |
| 2024/0147684 | A1* | 5/2024 | Liaw | H01L 27/0207 |

OTHER PUBLICATIONS

Hong, the specification, including the claims, and drawings in the U.S. Appl. No. 18/645,319, filed Apr. 24, 2024.

Lin, the specification, including the claims, and drawings in the U.S. Appl. No. 17/706,613, filed Mar. 29, 2022.

* cited by examiner

METHOD OF FABRICATING A SEMICONDUCTOR LAYOUT AND A SEMICONDUCTOR STRUCTURE

BACKGROUND OF THE INVENTION

1. Field of the Invention

The present disclosure relates to a technical field of fabricating semiconductor, and more particularly, to a method of fabricating a semiconductor layout and a semiconductor structure.

2. Description of the Prior Art

In the fabrication of integrated circuits (ICs), photolithography has been an essential technique. At present, the resolution required by photolithography at 32 nm node and below has exceeded the limit capability of the present mask aligner. Therefore, the double patterning technique (DPT), which can enlarge the minimum pattern distance on the present mask aligner, has become the solution for the line width between 32 nm to 22 nm. DPT technology includes decomposing a set of high-density circuit patterns into two or more sets of low-density circuit patterns; then fabricating photomasks having the sets of low-density circuit patterns respectively which can be used in the corresponding exposure and etching processes; and finally forming a merged pattern corresponding to the high-density patterns as originally required.

However, because DPT must go through multiple exposure processes, overlay control and alignment have always been a concern of DPT, and the problem of overlay control and alignment is more prominent when the high-density circuit pattern is decomposed into two or more sets of circuit patterns with lower density. When DPT occurs overlay errors or inaccurate alignment occur in DPT, it will lead to disconnection or connection of circuit patterns, resulting in serious open circuit or short circuit. Therefore, there is still a need in the industry for a method of fabricating semiconductor layout and semiconductor structure that can overcome the above problems.

SUMMARY OF THE INVENTION

One of the objectives of the present disclosure provides a method of fabricating a semiconductor layout, in which, an optical proximity correction technique is used to modify an original layout, so as to prevent the connection patterns with dimensions and/or pitches that violates the predetermined rule of photolithography, from causing significant light diffraction during fabricating corresponding patterns of photomask. Accordingly, the present disclosure may improve the quality of the photomask.

Another one of the objectives of the present disclosure provides a method of fabricating a semiconductor structure, in which, an optical proximity correction technique is used to modify an original layout, so that, the photomask formed by outputting the original layout may therefor include more accurate patterns and contours. With these arrangements, the semiconductor structure formed through the photomask may significantly improve the reliability of the electrically connection between the metal lines and the conductive pads through a simplified process flow without additionally photolithography step, even when the dimensions and the pitches of the connection patterns which are adjacent with each other, or the dimensions and the pitches of the connection patterns and the to-be split pattern which are adjacent with each other, violate the predetermined rule of photolithography.

To achieve the purpose described above, one embodiment of the present disclosure provides a method of forming a semiconductor layout including the following steps. A layout is provided, and the layout includes a plurality of connection patterns separately arranged with each other. The connection patterns are decomposed to a plurality of first connection patterns and a plurality of second connection patterns alternatively arranged with each other. An optical proximity correction process is performed on the first connection patterns and the second connection patterns to form a plurality of third connection patterns and a plurality of fourth connection patterns, wherein at least a portion of the third connection patterns is overlapped with the fourth connection patterns. The third connection patterns and the fourth connection patterns are outputted to form photomasks.

To achieve the purpose described above, one embodiment of the present disclosure provides a method of forming a semiconductor structure including the following steps. A layout is provided, and the layout includes a plurality of connection patterns separately arranged with each other. The connection patterns are decomposed to a plurality of first connection patterns and a plurality of second connection patterns alternatively arranged with each other. An optical proximity correction process is performed on the first connection patterns and the second connection patterns to form a plurality of third connection patterns and a plurality of fourth connection patterns, wherein at least a portion of the third connection patterns is overlapped with the fourth connection patterns. The third connection patterns and the fourth connection patterns are outputted to form photomasks, and the photomask is transferred into a target layer to form a plurality of first patterns and a plurality of second patterns, wherein the first patterns are not overlapped with the second patterns.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic diagrams illustrating a method of fabricating a semiconductor layout according to one embodiment in the present disclosure, wherein:

FIG. 1 shows a plan view of a semiconductor layout according to one embodiment in the present disclosure;

FIG. 2 shows a plan view of a discomposed layout according to one embodiment in the present disclosure;

FIG. 3 shows a plan view of another discomposed layout according to one embodiment in the present disclosure;

FIG. 4 shows a plan view of a discomposed modification layout according to one embodiment in the present disclosure;

FIG. 5 shows a plan view of another discomposed modification layout according to one embodiment in the present disclosure; and FIG. 6 shows a plan view of a modification layout according to one embodiment in the present disclosure.

FIG. 7 to FIG. 9 are schematic diagrams illustrating a method of fabricating a semiconductor structure according to one embodiment in the present disclosure, wherein:

FIG. 7 shows a cross-sectional view of a semiconductor structure after forming a photoresist structure according to one embodiment in the present disclosure;

FIG. 8 shows a cross-sectional view of a semiconductor structure after forming a photoresist structure after forming another photoresist structure according to one embodiment in the present disclosure; and FIG. 9 shows a cross-sectional view of a semiconductor structure after forming a photoresist structure after patterning a target layer according to one embodiment in the present disclosure.

FIG. 10 to FIG. 14 are schematic diagrams illustrating a method of fabricating a semiconductor layout according to another embodiment in the present disclosure, wherein:

FIG. 10 shows a plan view of a discomposed layout according to another embodiment in the present disclosure;

FIG. 11 shows a plan view of another discomposed layout according to another embodiment in the present disclosure;

FIG. 12 shows a plan view of a discomposed modification layout according to another embodiment in the present disclosure;

FIG. 13 shows a plan view of another discomposed modification layout according to another embodiment in the present disclosure; and FIG. 14 shows a plan view of a modification layout according to another embodiment in the present disclosure.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
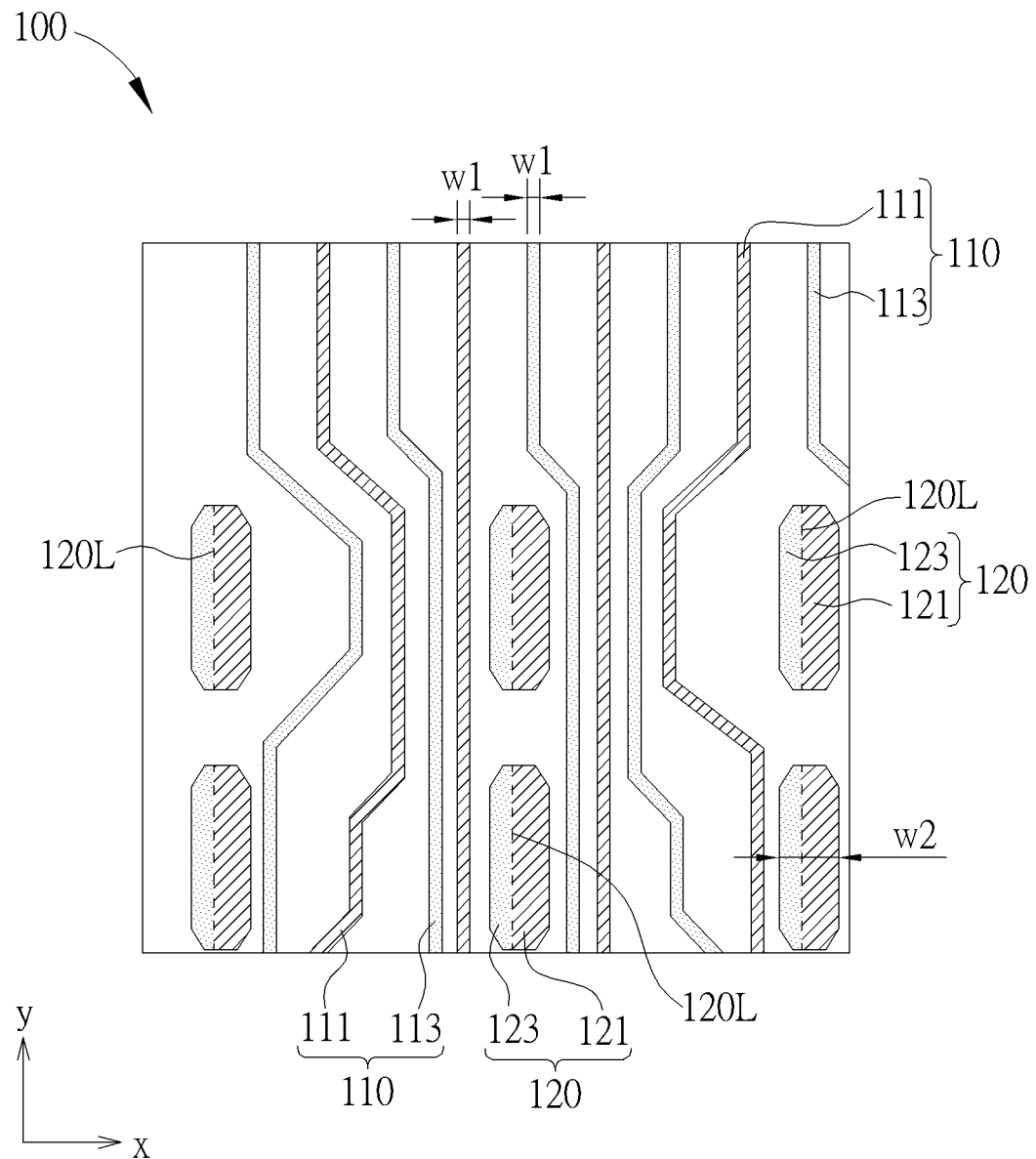

Please refer to FIGS. 1-6, which are plan schematic diagrams illustrating a method of fabricating the semiconductor layout according to one embodiment of the present disclosure. Firstly, as shown in FIG. 1, a layout 100 is provided, the layout 100 may be a layout of metal connection layers for fabricating semiconductor devices (for example, memory devices such as dynamic random access memory or static random access memory), such as the layout of a 0-th metal layer (M0) and a first metal layer (M1), but is not limited thereto. The layout 100 includes a plurality of patterns arranged with each other, and the dimension (not shown in the drawings) of the patterns or the pitches (not shown in the drawings) between the patterns are preferably smaller than the critical dimension for photolithography, so that, the semiconductor devices may enable to achieve a relative higher integration. The patterns for example include a plurality of connection patterns 110 which are separately arranged with each other and at least one to-be-split pattern 120, and the to-be-split pattern 213 is arranged between two adjacent ones of the connection patterns 110. Precisely speaking, the connection patterns 110 are respectively extended along a direction (for example the y-direction as shown in FIG. 1), and which are sequentially arranged in another direction (for example the x-direction as shown in FIG. 1) being perpendicular to the direction (y-direction). It is noted that, at least a part of each connection pattern 110 is not extended along the direction (y-direction), but on the whole, each of the connection patterns 110 may be regarded as extending along the direction (y-direction), as shown in FIG. 1. On the other hand, the to-be-split pattern 120 is also extended along the direction (y-direction), and arranged between any two adjacent ones of the connections patterns 110. In one embodiment, a maximum width W2 of the to-be-split pattern 120 is larger than a maximum width W1 of the connection patterns 110, for example being about 2 to 3 times larger than the maximum width W1 of the connection patterns 110, but is not limited thereto. People in the art should fully realize that although six to-be-split patterns 120 are exemplified in the layout 100 of the present embodiment, with each two of them being arranged in the direction (y-direction) for example, and with each to-be-split pattern in alignment with each other in the another direction (x-direction), as shown in FIG. 1, the detailed number and arrangement of the to-be-split patterns 120 are not limited to those shown in FIG. 1 and may be further adjusted according to practical product requirements.

Figure 2:
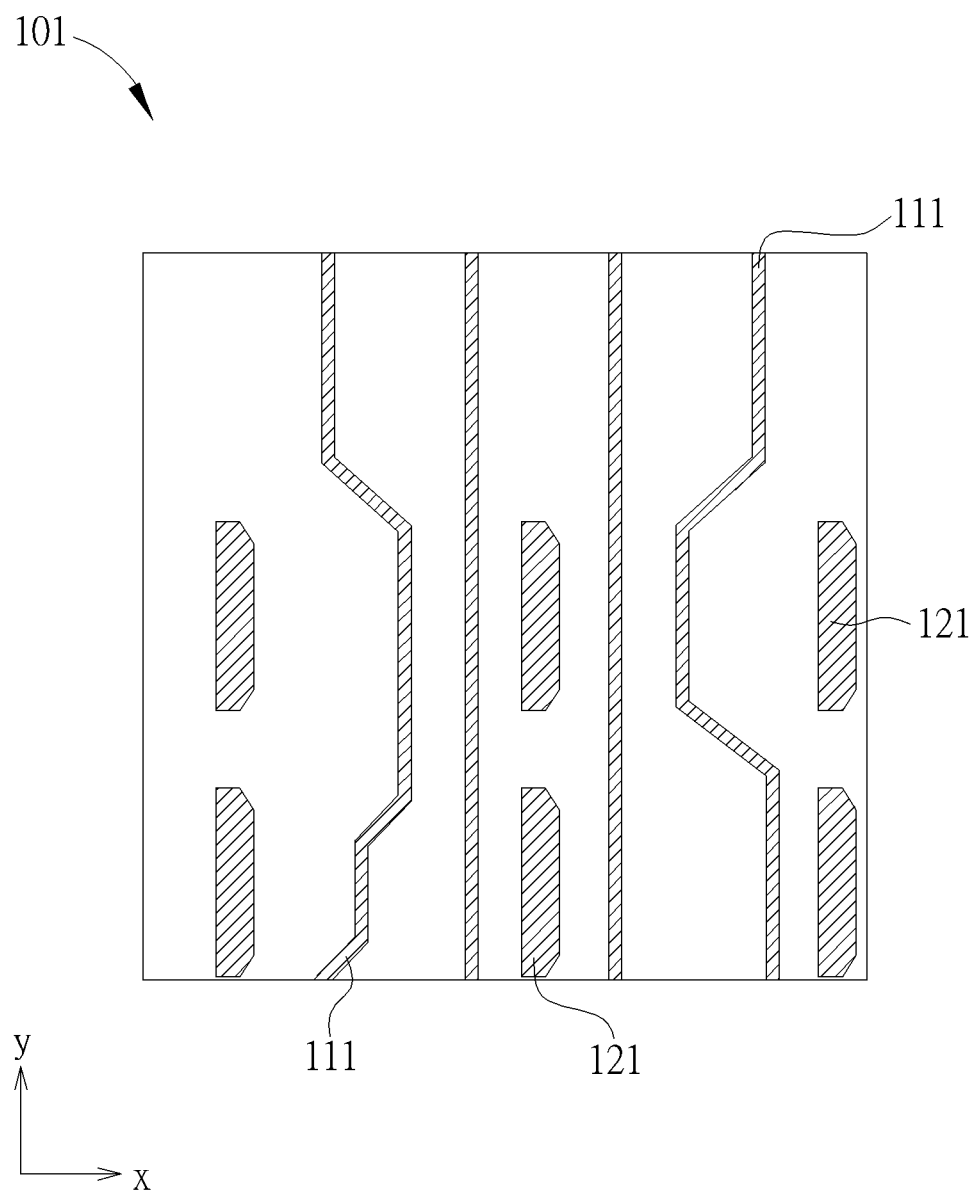
Figure 3:
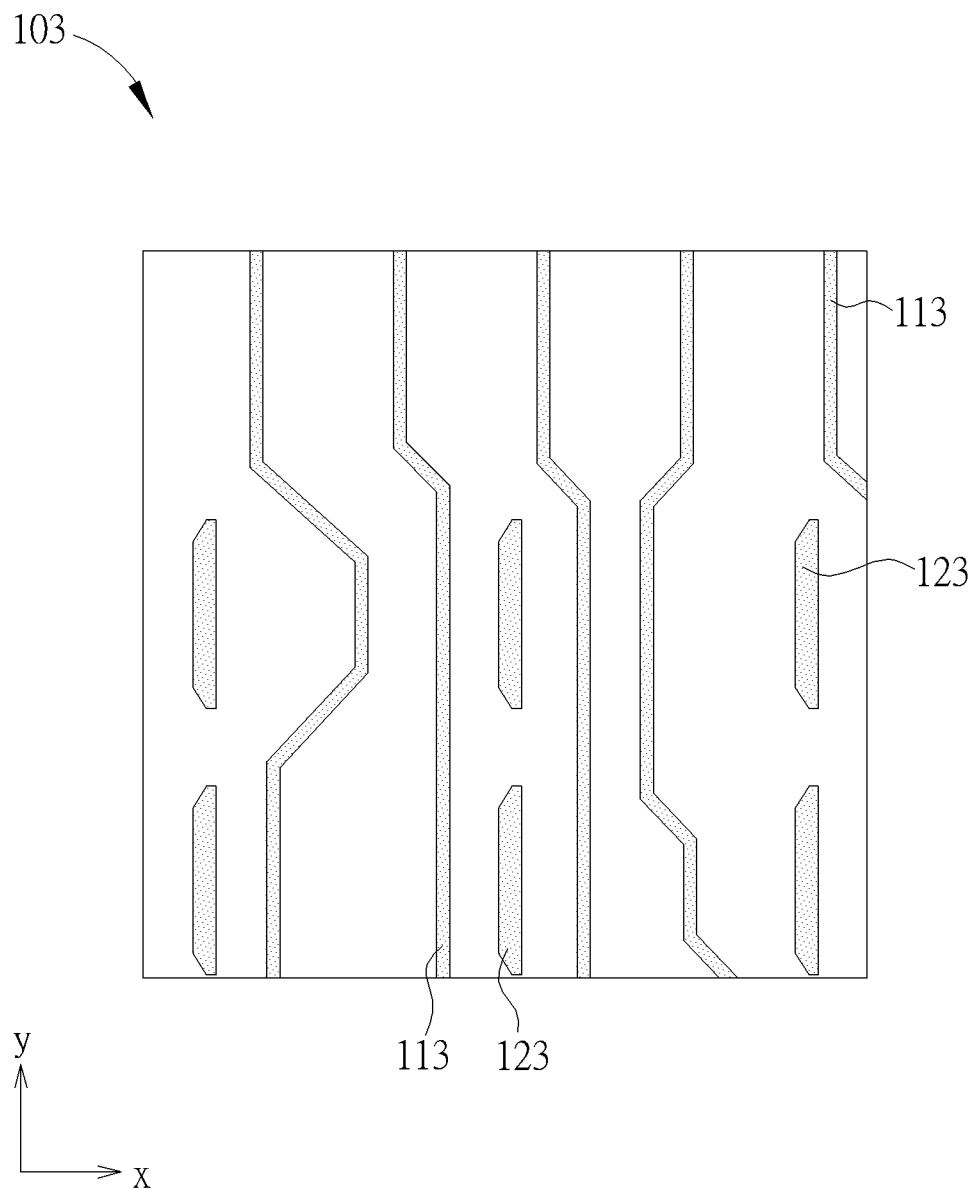

Next, the layout 100 is inputted into a computer set (not shown in the drawings), and the layout 100 is decomposed by using the computer set, in which the connections patterns 110 of the layout 100 are decomposed to a plurality of first connection patterns 111 and a plurality of second connection patterns 113, and each of the to-be-split patterns 120 of the layout 100 are split into a cutting portion 121 and a counterpart cutting portion 123. It is noted that, the first connection patterns 111 and the second connection patterns 113 are alternatively arranged with each other, with each of the first connection patterns 111 being arranged between two adjacent ones of the second connection patterns 113, and with each of the second connection patterns 113 being arranged between two adjacent ones of the first connection patterns 111, as shown in FIG. 1. Furthermore, the to-be-split patterns 120 is split into the cutting portion 121 and the counterpart cutting portion 123 through a boundary line 120L, wherein the cutting portion 121 is arranged adjacent to the second connection patterns 113, and the counterpart cutting portion 123 is arranged adjacent to the first connection patterns 111, but is not limited thereto. It is also noted that, the boundary line 120L of the present embodiment is preferably closed to the counterpart cutting portion 123, so that the area of the cutting portion 121 may be relative greater than the area of the counterpart cutting portion 123, as shown in FIG. 1, but is not limited thereto. Accordingly, after the layout 100 is decomposed, a decomposed layout 101 as shown in FIG. 2 and another decomposed layout 103 as shown in FIG. 3 may be therefore formed, the decomposed layout 101 includes the first connection patterns 111 and the cutting portion 121 arranged with each other, and the another decomposed layout 103 includes the second connection patterns 113 and the counterpart cutting portion 123.

Figure 4:
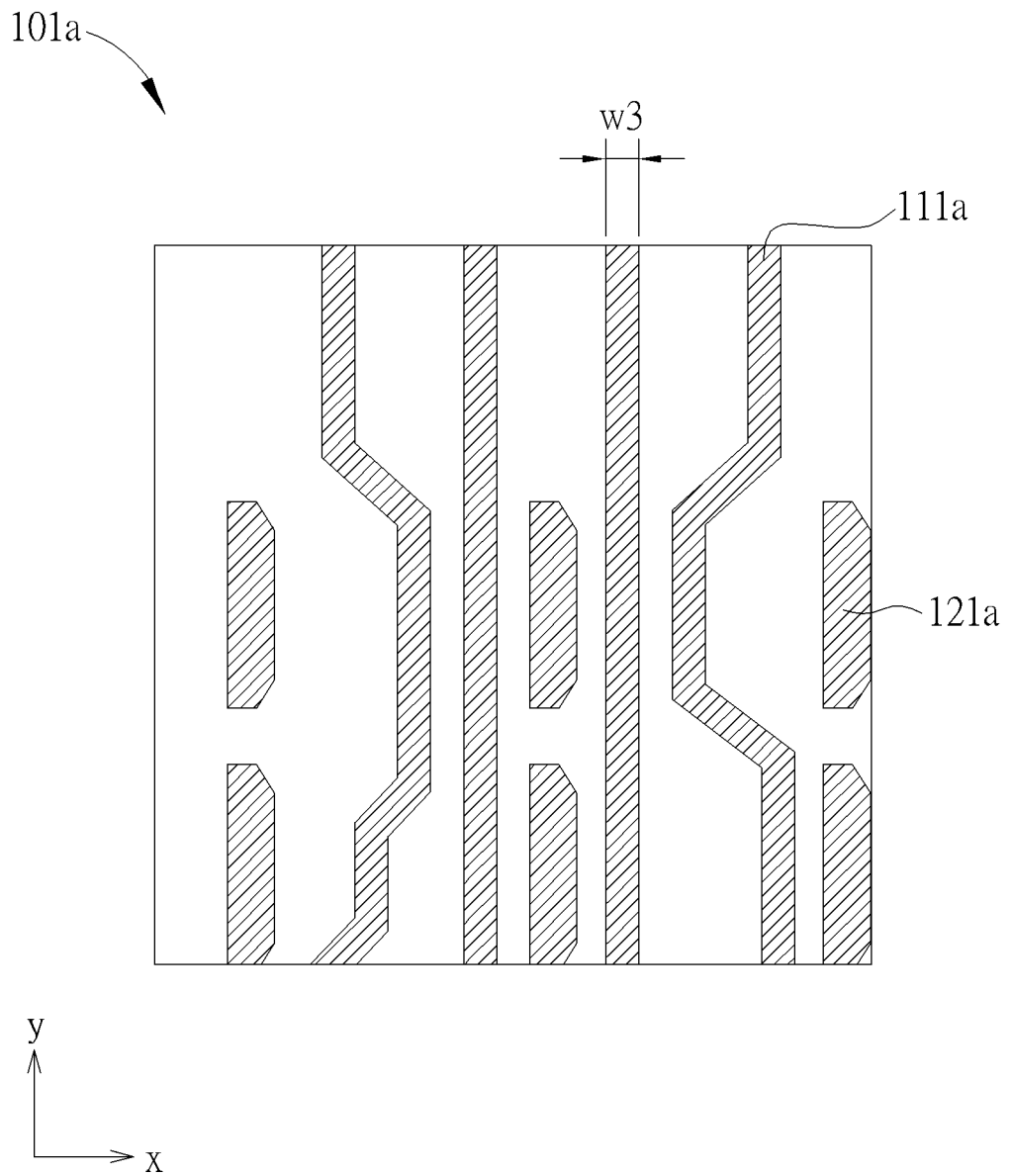
Figure 5:
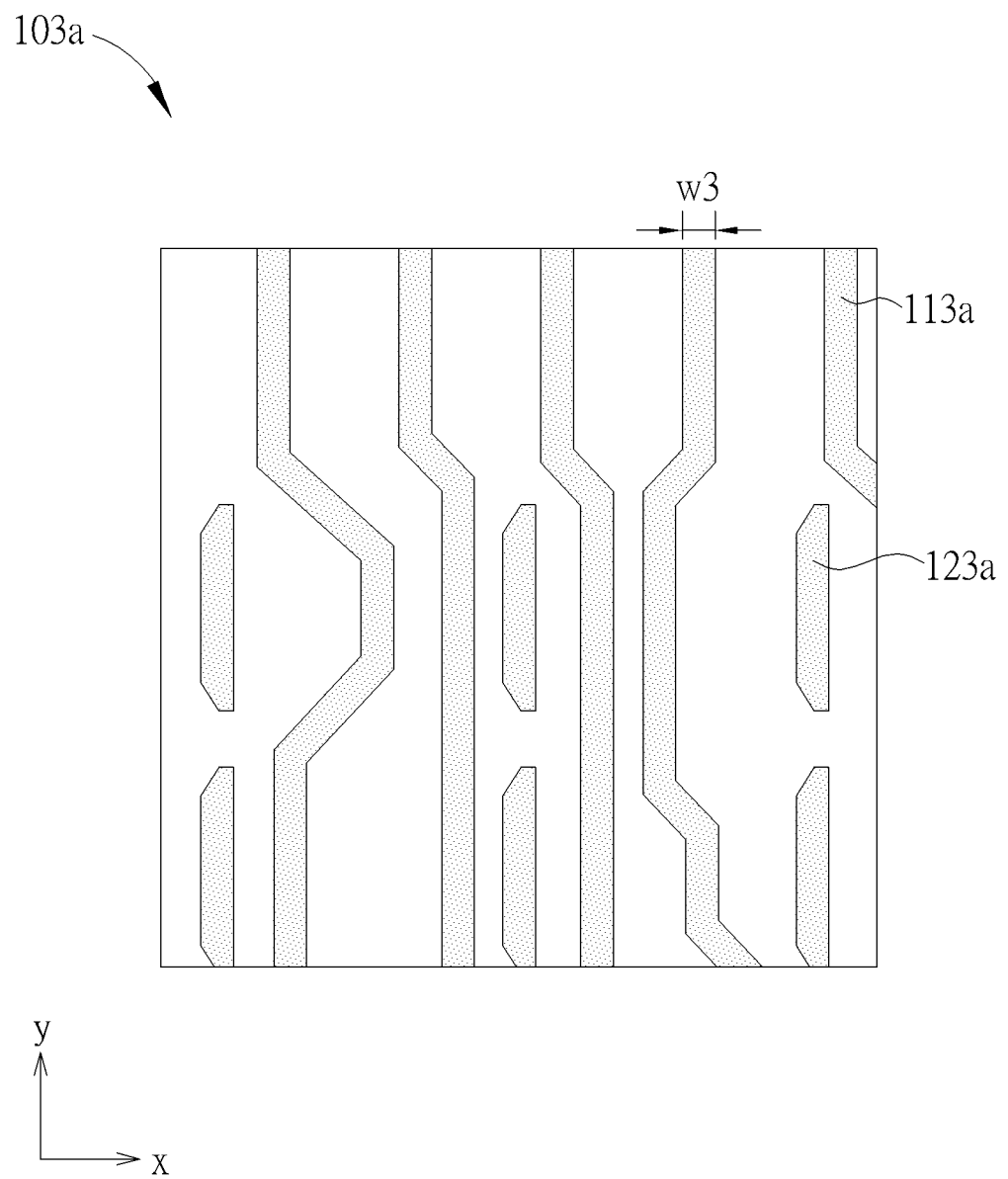

Next, an optical proximity correction process is performed respectively on the decomposed layout 101 and the another decomposed layout 103, to form a modification layout 101a as shown in FIG. 4 and another modification layout 103a as shown in FIG. 5. The optical proximity correction process is performed through the computer set to process the first connection patterns 111 and the cutting portion 121 in the decomposed layout 101, which includes laterally expanding the first connection patterns 111 and the cutting portion 121 along the another direction (the x-direction) to form a plurality of third connection patterns 111a and at least one cutting modification portion 121a, thereby forming the modification layout 101a. preferably, the first connection patterns 111 and the cutting portion 121 are proportionally enlarged to both sides in the another direction (x-direction), so that each of the third connection patterns 111a may therefore obtain an enlarged width W3, as shown in FIG. 4. On the other hand, the optical proximity correction process is performed through the computer set to process the second connection patterns 113 and the counterpart cutting portion 123 in the decomposed layout 103, and which also includes laterally expanding the second connection patterns 113 and the counterpart cutting portion 123 along the another direction (the x-direction) to form a plurality of fourth connection patterns 113a and at least one counterpart cutting modification portion 123a, thereby forming the modification layout 103a. The second connection patterns 113 and the counterpart cutting portion 123 are also proportionally enlarged to both sides in the another direction (x-direction), so that each of the fourth connection patterns 113a may also obtain the enlarged width W3, as shown in FIG. 5. In one embodiment, the width W3 of each third connection pattern 111a or each fourth connection pattern 113a may be 1.5 to 3 times larger than the width W1 of each first connection pattern 111 or each second connection pattern 113, but is not limited thereto.

Then, the third connection patterns 111a and the cutting modification portion 121a in the modification layout 101a and the fourth connection patterns 113a and the counterpart cutting modification portion 123a are outputted through the computer set to format least one photomask (not shown in the drawings). Preferably, the third connection patterns 111a and the cutting modification portion 121a are outputted simultaneously to form a first photomask, with the first photomask including patterns corresponding to the third connection patterns 111a and the cutting modification portion 121a respectively, and the fourth connection patterns 113a and the counterpart cutting modification portion 123a are outputted simultaneously to form a second photomask, with the second photomask including patterns corresponding to the fourth connection patterns 113a and the counterpart cutting modification portion 123a. After that, photolithography processes are respectively performed through the first photomask and the second photomask, but is not limited thereto. Through these performances, the method of fabricating the semiconductor layout according to one embodiment of the present disclosure is accomplished.

Figure 6:
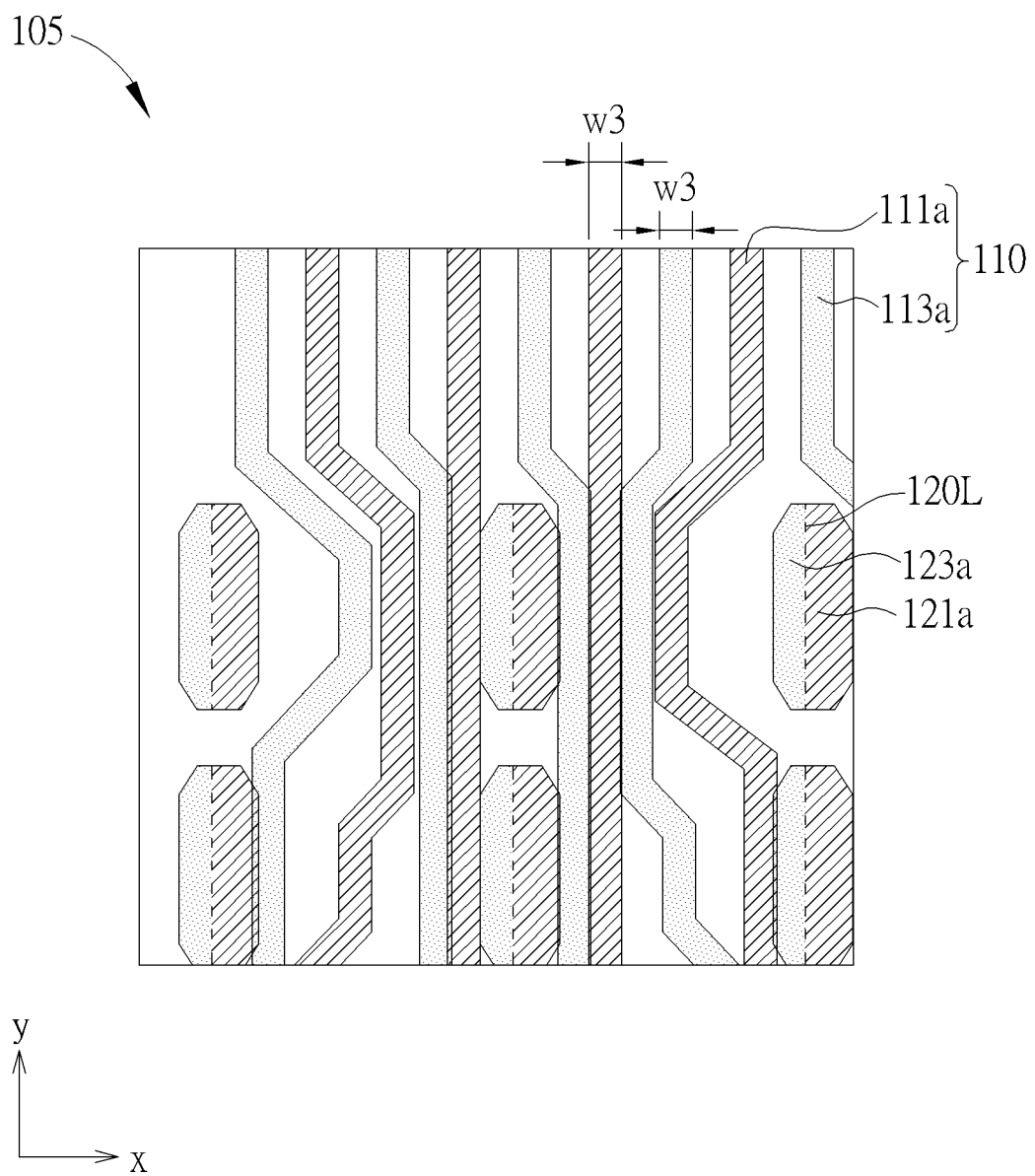

It is noteworthy that, after performing the optical proximity correction process through the computer set, if the modification layout 101a and the modification layout 103a are further integrated into a modification layout 105 as shown in FIG. 6, the third connection patterns 111a and the fourth connection patterns 113a are alternately arranged with each other substantially, and at least a portion of the third connection patterns 111a are partially overlapped with the fourth connection patterns 113a, with the overlapping portion therebetween being about 10% to 50% of the area of the third connection patterns 111a or the area of the fourth connection patterns 113a. Meanwhile, at least a portion of the third connection patterns 111a are partially overlapped with the counterpart cutting modification portion 123a, with the overlapping portion therebetween being about 10% to 50% of the area of the counterpart cutting modification portion 123a or the area of the third connection patterns 111a, and at least a portion of the fourth connection patterns 113a are partially overlapped with the cutting modification portion 121a, with the overlapping portion therebetween being about 10% to 50% of the area of the cutting modification portion 121a or the area of the fourth connection patterns 113a. On the other hand, the cutting modification portion 121a and the counterpart cutting modification portion 123a are still arranged between adjacent ones of the third connection patterns 111a and the fourth connection patterns 113a, and the cutting modification portion 121a is still partially overlapped with the counterpart cutting modification portion 123a, with the overlapping portion therebetween being about 10% to 50% of the area of the counterpart cutting modification portion 123a or the area of the cutting modification portion 121a, as shown in FIG. 6. However, while the third connection patterns 111a and the cutting modification portion 121a in the modification layout 101a, and the fourth connection patterns 113a and the counterpart cutting modification portion 123a in the modification layout 103a are respectively outputted to form the first photomask and the second photomask, followed by being transferred to a photoresist layer (not shown in the drawings) through the subsequent exposure and development processes, the width of the corresponding patterns (not shown in the drawings) formed on the photoresist layer based on the third connection patterns 111a and the fourth connection patterns 113a may be proportionally shrunk, and the corresponding patterns based on the third connection patterns 111a and the fourth connection patterns 113a may not overlap with each other. Likewise, the width of corresponding patterns (not shown in the drawings) formed on the photoresist layer based on the cutting modification portion 121a and the counterpart cutting modification portion 123a may also be proportionally shrunk, and the corresponding patterns based on the cutting modification portion 121a and the counterpart cutting modification portion 123a compose to a pattern corresponding to the to-be-split pattern 120 in the layout 100. Accordingly, using the overlapped relationship between the third connection patterns 111a and the fourth connection patterns 113a may improve the possible issues such as light diffraction or poor photolithography caused by the connection patterns 110 in the layout 100 with dimensions and/or pitches that violates the predetermined rule of photolithography, and also, improve the patterns and contours of the first photomask and the second photomask formed by outputting the modification layout 101a and the modification layout 103a. Thus, the quality of the photomask may be significantly improved.

According to the method of the present embodiment, the layout 100 is firstly decomposed to enlarge the pitches between the patterns in the layout, thereby forming the decomposed layouts 101, 103. As following, the optical proximity correction technique is performed on the first connection patterns 111, second connection patterns 113, cutting portion 121 and the counterpart cutting portion 123 in the decomposed layouts 101, 103, to laterally expand the width of the aforementioned patterns, so that, the connection patterns 110 in the layout 100 with dimensions and/or pitches that violates the predetermined rule of photolithography may at least partially overlapped with each other, to form the third connection patterns 111a with at least a portion thereof being partially overlapped with the fourth connection patterns 113a. With these arrangements, through the third connection patterns 111a with at least a portion thereof being partially overlapped with the fourth connection patterns 113a may effectively improve the technical problems such as process defects or inaccurate pattern contours caused by the connections patterns 110 in the layout 100 with dimensions and/or pitches that violates the predetermined rule of photolithography, and the photomasks with more accurate patterns and contours may be successfully formed based on the layout 100 under the method of the present embodiment. Thus, the method of the present embodiment enables to optimize the quality of the photomask.

Figure 7:
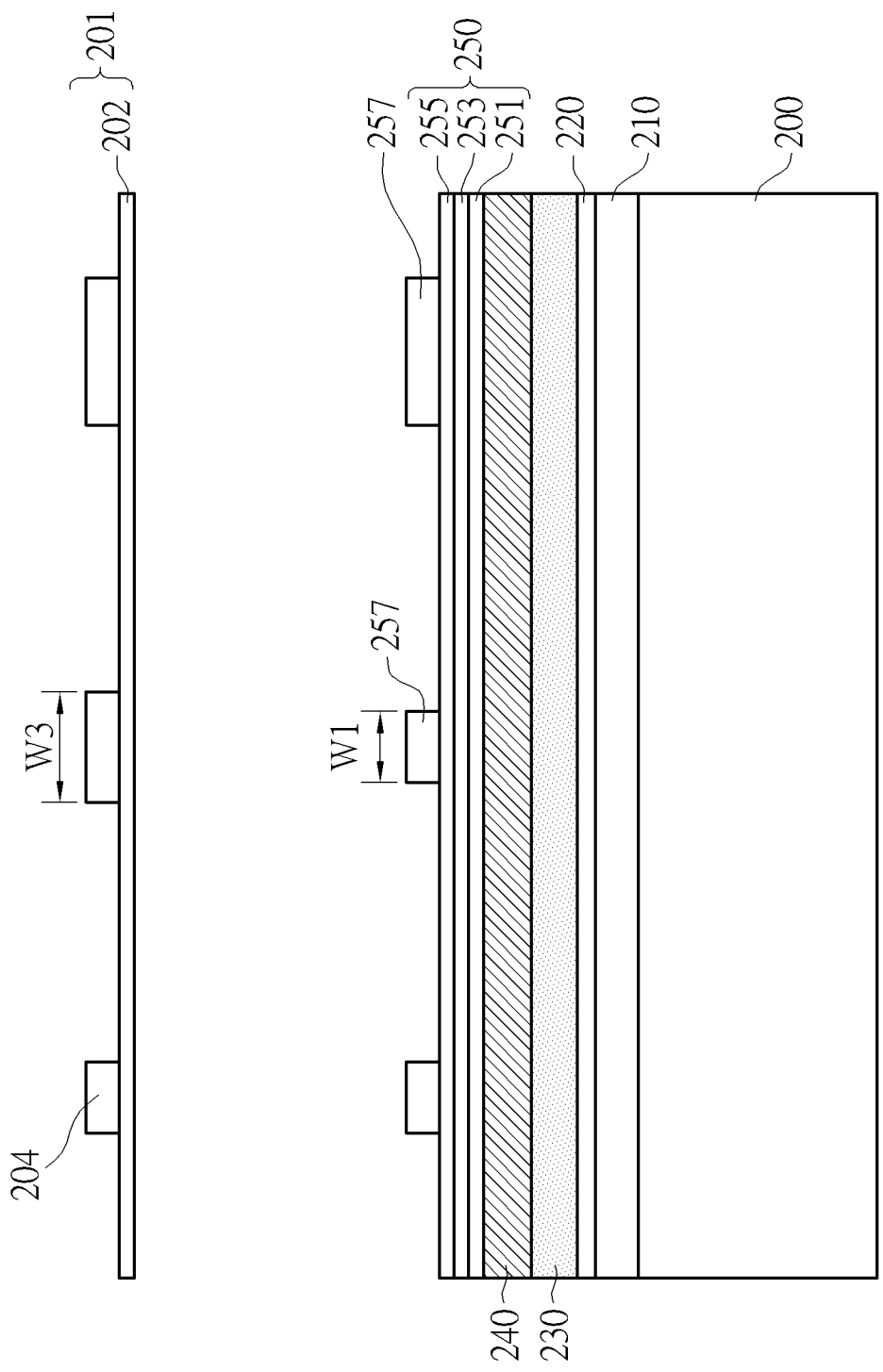
Figure 8:
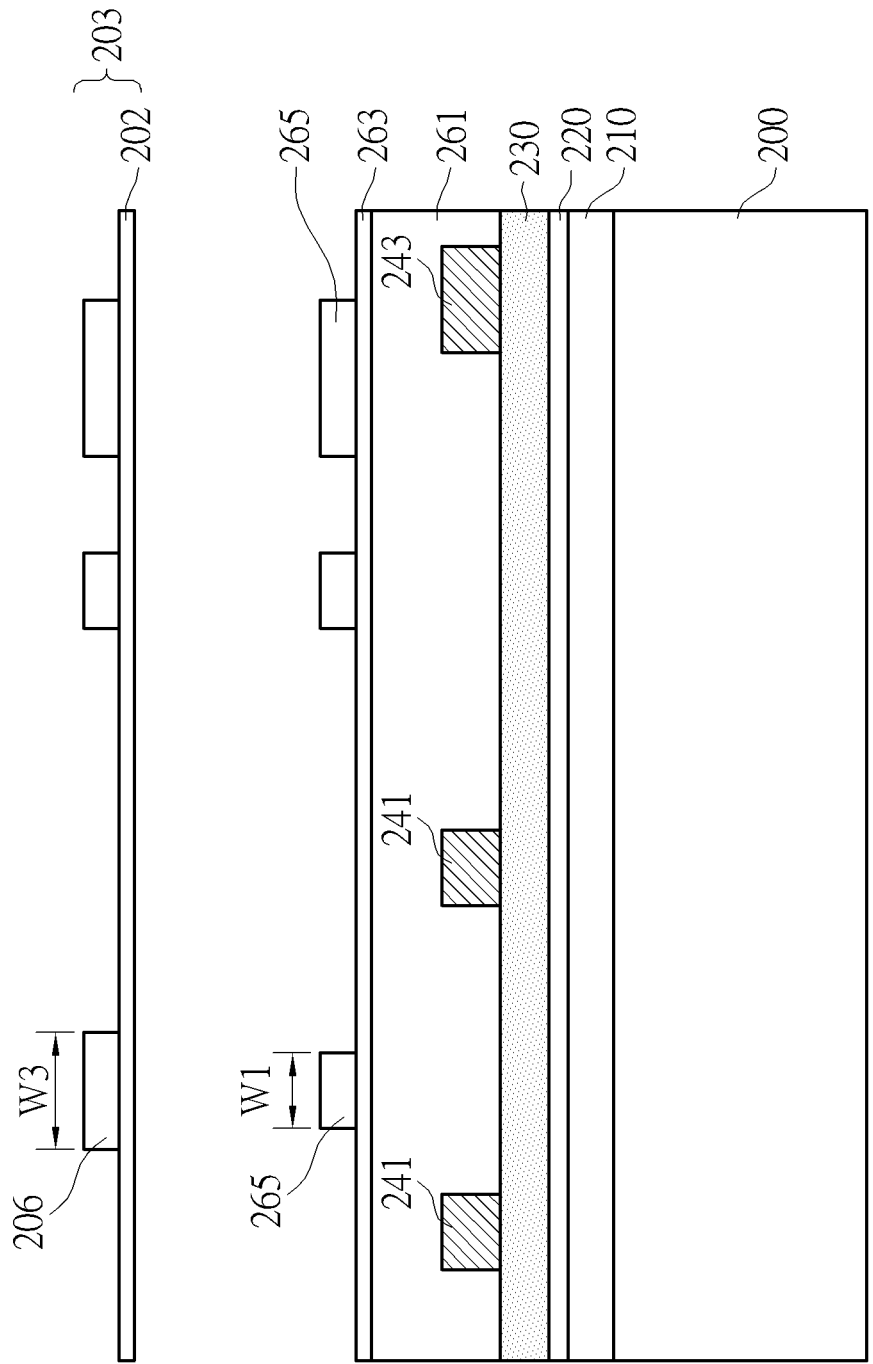
Figure 9:
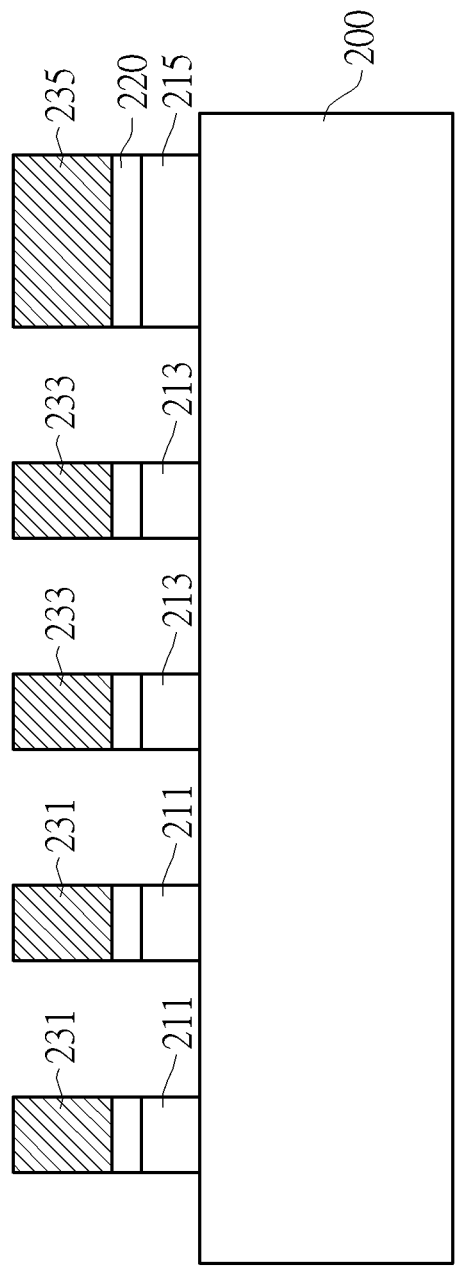

Please refer to FIGS. 7-9, which are schematic diagrams illustrating a method of fabricating a semiconductor structure according to one embodiment in the present disclosure. Firstly, as shown in FIG. 7, a substrate 200 is provided, the substrate 200 may be a silicon substrate, a silicon-containing substrate (such as SiC, SiGe), or a silicon-on-insulator (SOI) substrate. Then, a target layer 210, a protection layer 220, a first mask layer 230, a second mask layer 240 and a photoresist structure 250 are sequentially formed on the substrate 200. In one embodiment, the target layer 210 may include a conductive layer for example including a low resistant metal like aluminum (Al), titanium (Ti), copper (Cu), or tungsten (w), or a dielectric layer, and the target layer 210 may be patterned into required patterns in the subsequent photolithography process. Furthermore, the protection layer 220 for example includes a dielectric material like silicon nitride (SiN), silicon oxide (SiO$_x$), or silicon oxynitride, and which is covered on the target layer 210 to protect the target layer 210 underneath. The first mask layer 230 and the second mask layer 240 may respectively include mask materials with different etching selectivity, such as silicon oxide or amorphous silicon, so that, the third connection patterns 111a and the cutting modification portion 121a of the modification layout 101a in the aforementioned embodiment may be transferred into the first mask layer 230, and then the fourth connection patterns 113a and the counterpart cutting modification portion 123a of the modification layer 103a in the aforementioned embodiment may be transferred into the second mask layer 240 in the subsequent processes, but is not limited to be the aforementioned order.

Please referring to FIG. 7, the photoresist structure 250 further includes a photoresist bottom layer 251, a photoresist intermediate layer 253, a bottom anti-reflective coating (BARC) layer 255, and a patterned photoresist layer 257. In one embodiment, the photoresist bottom layer 251 may be a spin-on carbon (SOC) layer, which provides a relatively flat surface for the photoresist deposited or coated thereon, so as to facilitate subsequent exposure and development processes. The material of the photoresist intermediate layer 253 may be silicon oxynitride, and the bottom anti-reflective coating layer 255 is used to reduce the reflected light between the photoresist and the substrate 200 during the exposure process. In the present embodiment, a second photomask 201 based on the modification layout 103a in the aforementioned embodiment is transferred to a photoresist layer (not shown in the drawings) through exposure and development processes, to form the patterned photoresist layer 257 which includes patterns corresponding to the second photomask. It is noted that, the second photomask includes a substrate 202 for light transmission, such as a transparent quartz substrate, and light shielding patterns 204 formed on the substrate 202, wherein each of the light shielding patterns 204 is corresponding to the fourth connection patterns 113a and the counterpart cutting modification portion 123a in the modification layout 103a respectively, and the light shielding patterns 204 corresponding to the fourth connection patterns 113a includes the corresponding width W3. It is also noted that, while each light shielding pattern 204 is transferred to the photoresist layer through the subsequent exposure and development processes to form the patterned photoresist layer 257, the width of the patterned photoresist layer 257 may be proportionally reduced, for example, being the width W1 based on the connection patterns 110 in the layout 100, but is not limited thereto.

Then, an etching process is performed to transfer patterns of the patterned photoresist layer 257 to the second mask layer 240 underneath, to form a plurality of first mask patterns 241 and at least one second mask pattern 243, as shown in FIG. 8. Patterns of the first mask patterns 241 may be the same as the patterns of the fourth connection patterns 113a in the modification layout 103a, and patterns of the second mask patterns 243 maybe the same as the pattern of the counterpart cutting modification portion 123a in the modification layout 103a, but not limited thereto. Next, a photoresist structure 260 is formed, to cover on the first mask patterns 241 and the second mask pattern 243. Precisely speaking, the photoresist structure 260 includes a photoresist bottom layer 261, a photoresist intermediate layer 263, and a patterned photoresist layer 265, wherein the photoresist bottom layer 261 may be an organic dielectric layer (ODL) to fill in the gaps between the first mask patterns 241 and the second mask pattern 243 to provide a flat surface on which photoresist is deposited or coated, and the photoresist intermediate layer 263 may include a silicon-containing hard-mask bottom anti-reflection coating (SHB) layer, but is not limited thereto. Also, in the present embodiment, the first photomask 203 based on the modification layout 101a in the aforementioned embodiment is transferred to another photoresist layer (not shown in the drawings) through exposure and development processes, to form the patterned photoresist layer 265 which includes patterns corresponding to the first photomask 203. It is noted that, the first photomask 203 also includes the a substrate 202 for light transmission, such as a transparent quartz substrate, and light shielding patterns 206 formed on the substrate 202, wherein each of the light shielding patterns 206 is corresponding to the third connection patterns 111a and the cutting modification portion 121a in the modification layout 101a respectively, and the light shielding patterns 206 corresponding to the third connection patterns 111a also includes the corresponding width W3. It is also noted that, while each light shielding pattern 206 is transferred to the another photoresist layer through the subsequent exposure and development processes to form the patterned photoresist layer 265, the width of the patterned photoresist layer 265 may be proportionally reduced, for example, being the width W1 based on the connection patterns 110 in the layout 100, but is not limited thereto.

As shown in FIG. 9, another etching process is performed to simultaneously transfer the patterns of the patterned photoresist layer 265, the first mask patterns 241 and the second mask pattern 243 to the first mask layer 230 underneath to form a plurality of third mask patterns 231, a plurality of fourth mask patterns 233, and at least one fifth mask pattern 235. Patterns of the third mask patterns 231 and the fourth mask patterns 233 may be respectively the same as the patterns of the fourth connection patterns 113a in the modification layout 103a and the third connection patterns 111a in the modification layout 101a. The third mask patterns 231 and the fourth mask patterns 233 are alternately arranged with each other, and a pattern of the fifth mask pattern 235 may be the same as the pattern of the to-be-split pattern 120 in the layout 100. Following these, another etching process may be further performed by using the third mask patterns 231, the fourth mask patterns 233, and the fifth mask pattern 235 as a mask to sequentially pattern the protection layer 220 and the target layer 210 underneath, so as to from a plurality of first patterns 211, a plurality of second patterns 213, and a third pattern 215 in the target layer 210. The first patterns 211 and the second patterns 213 are separately and alternately arranged with each other, and the first patterns 211 are not overlapped with the second patterns 213. The third pattern 215 is arranged at aside of the first patterns 211 and the second patterns 213, as shown in FIG. 9. Through these performances, the method of fabricating the semiconductor structure in the present embodiment is accomplished.

According to the method of the present embodiment, the first photomask 203 and the second photomask 201 based on the modification layout 101a, 103a respectively are transferred to different photoresist layers through different photolithography processes, to form the patterned photoresist layers 265, 257, followed by patterning the target layer 210 through the patterned photoresist layer 265, 257, to form the first patterns 211, the second patterns 213, and the third pattern 215. In this way, patterns of the first patterns 211, the second patterns 213 and the third pattern 215 in the target layer 210 may be corresponding to the connection patterns 110 and the to-be-split pattern 120, obtaining corresponding dimensions and pattern contours. Therefore, the method of the present embodiment enables to effectively and faithfully transfer the connection patterns 110 of the layout 100 to a semiconductor wafer through the photolithography process, so as to prevent the patterns from being break or having vague pattern contours.

People well known in the arts should easily realize the method of fabricating the semiconductor layout in the present disclosure is not limited to the aforementioned embodiment, and may further include other examples or variety. For example, in order to further modify the connection patterns 110 in the layout 100 with dimensions and/or pitches that violates the predetermined rule of photolithography, additional processes may be further performed either before or after performing the optical proximity correction process. The following description will detail the different embodiments of the method of fabricating the semiconductor layout in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIGS. 10-14, which are plan schematic diagrams illustrating a method of fabricating the semiconductor layout according to another embodiment of the present disclosure. The method of fabricating the semiconductor layout in the present embodiment is substantially the same as the method of fabricating the semiconductor layout in the aforementioned embodiment as shown in FIGS. 1-3, and all similarities will not be redundantly described thereinafter. The differences between the present embodiment and the aforementioned embodiment is mainly in that a plurality of dummy connection patterns is previously formed in the decomposed layout 101 and in the decomposed layout 103, before performing the optical proximity correction process, with each pattern (including the first connection patterns 111, the second connection patterns 113, the cutting portion 121, the counterpart cutting portion 123 and the said dummy connection patterns) in the decomposed layout 101 and the decomposed layout 103 may obtaining the same pitch substantially. Accordingly, the decomposed layout 101 and the decomposed layout 103 may therefore maintain a certain degree of integration as a whole, so as to facilitate the subsequent exposure manufacturing process.

Figure 10:
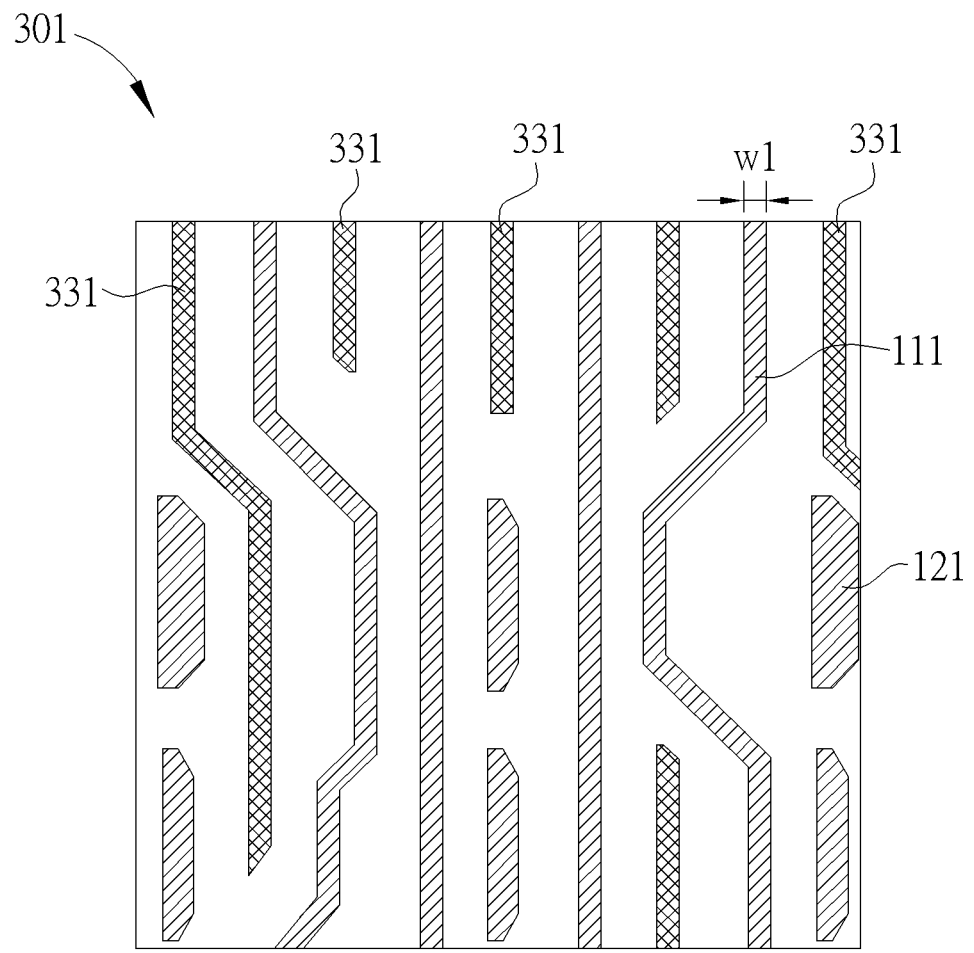
Figure 11:
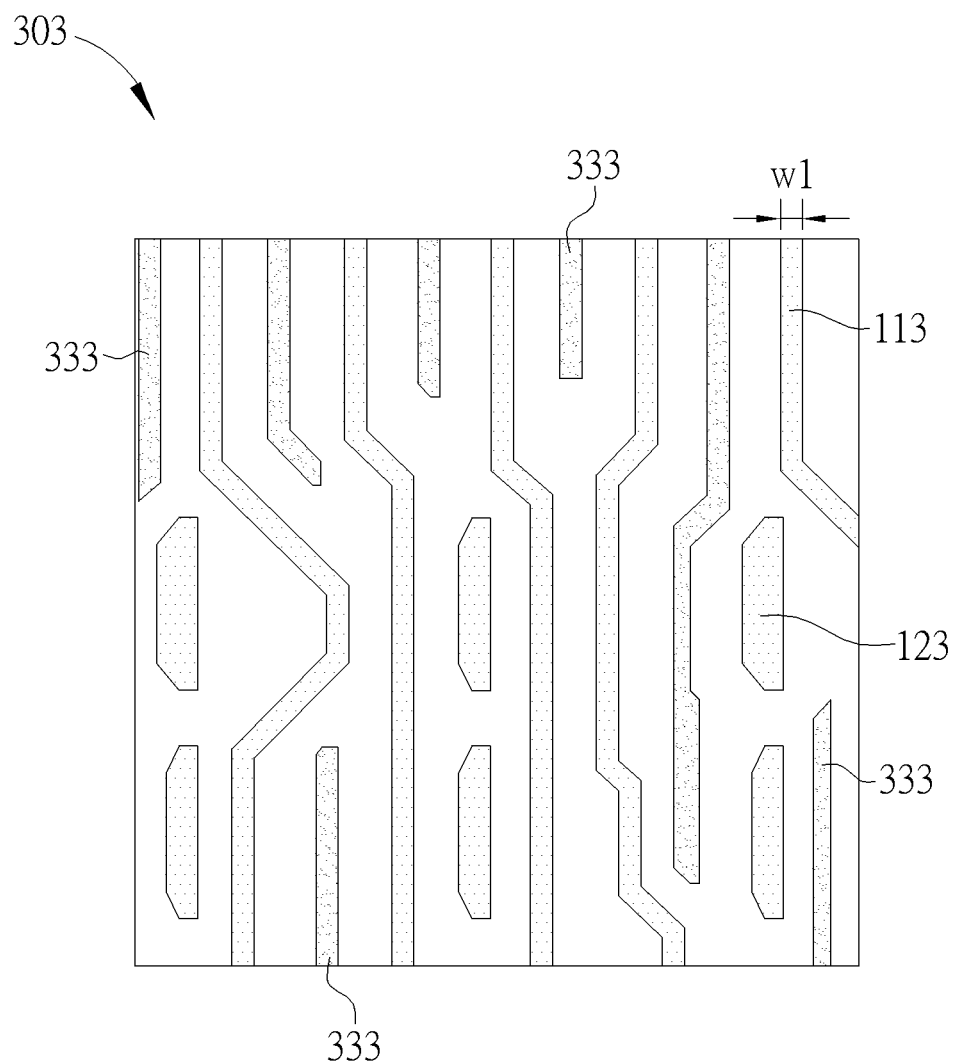

Precisely speaking, a plurality of first dummy connection patterns 331 separately arranged with each other is formed in the decomposed layout 101, to arrange either between any two adjacent ones of the first connection patterns 111, or between the adjacent ones of the first connecting patterns 111 and the cutting portion 121, and then, a decomposed layout 301 as shown in FIG. 10 is formed thereby. Also, a plurality of second dummy connection patterns 333 separately arranged with each other is formed in the decomposed layout 103, to arrange either between any two adjacent ones of the second connection patterns 113, or between adjacent ones of the second connecting patterns 113 and the counterpart cutting portion 123, and then, a decomposed layout 303 as shown in FIG. 11 is formed thereby. It is noted that, according to the decomposed layout 301, the first dummy connection patterns 331 are completely not overlapped with the first connection patterns 111 or the cutting portion 121. Preferably, the arranged locations of the first dummy connection patterns 331 may partially overlap the arranged locations of the second connection patterns 113 in the layout 100, and each of the first dummy connection patterns 331 may have the same maximum width W1 as each first connection pattern 111. According to the decomposed layout 303, the second dummy connection patterns 333 are completely not overlapped with the second connection patterns 113 or the counterpart cutting portion 123. Preferably, the arranged locations of the second dummy connection patterns 333 may partially overlap the arranged locations of the first connection patterns 111 in the layout 100, and has the same maximum width W1 as each second connection pattern 113. It is also noted that, if the decomposed layout 301 and the decomposed layout 303 are further integrated into a modification layout (not shown in the drawings), the arranged locations of the first dummy connection patterns 331 maybe optionally not overlapped with the second dummy connection patterns 333, or partially overlapped with the second dummy connection patterns 333. The relative relationship between the first dummy connection patterns 331 and the second dummy connection patterns 333 may be further adjusted based on the practical requirements of the actual semiconductor layout.

Figure 12:
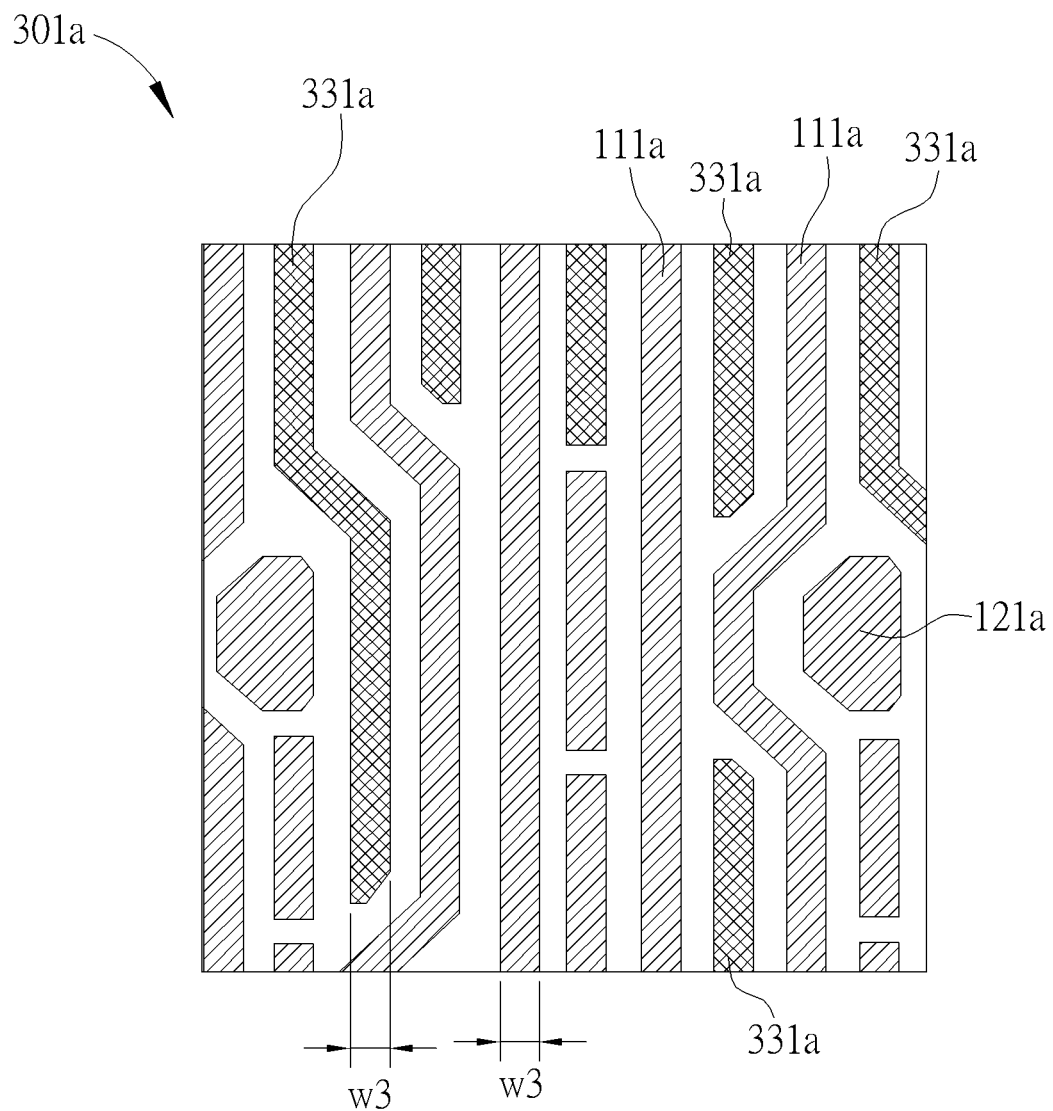
Figure 13:
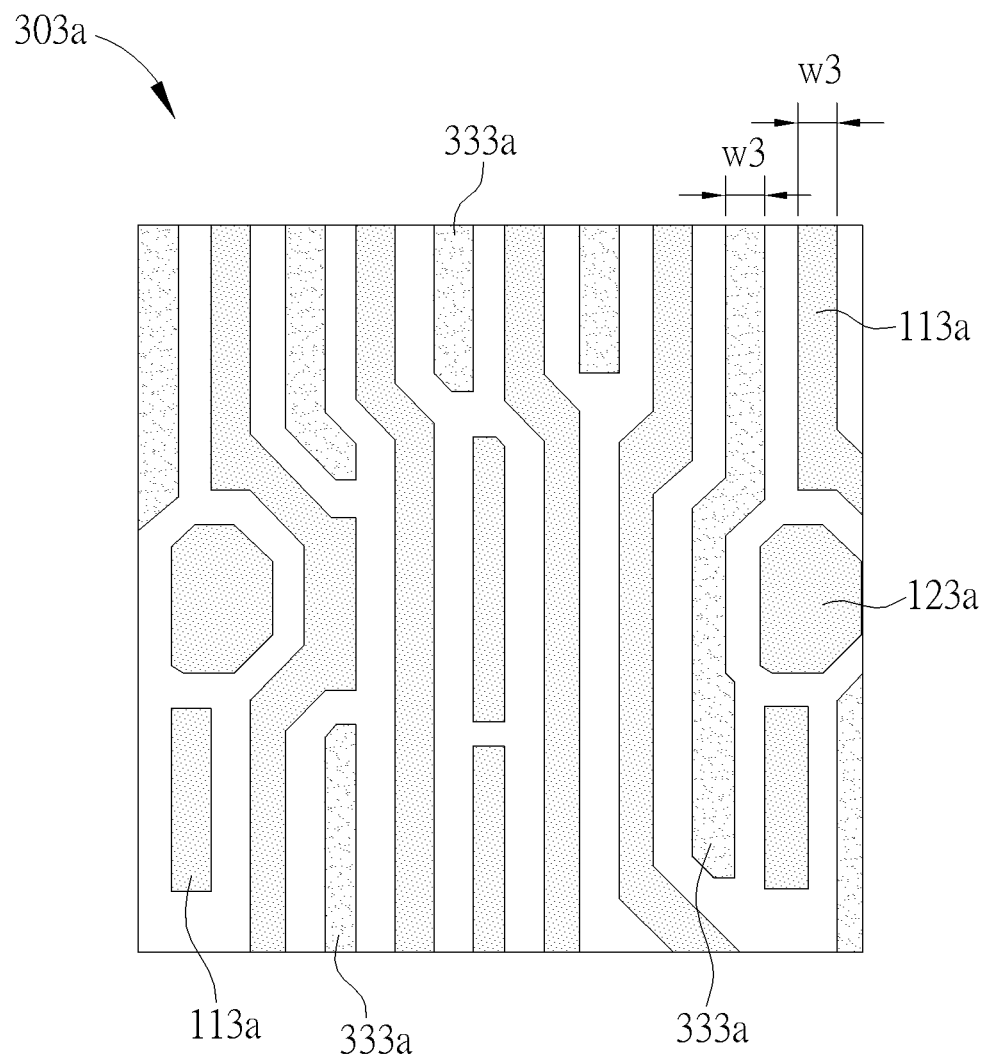

Then, an optical proximity correction process is performed respectively on the decomposed layout 301 and the another decomposed layout 303, to form a modification layout 301a as shown in FIG. 12 and another modification layout 303a as shown in FIG. 13. The optical proximity correction process is performed through the computer set to process the first connection patterns 111, the first dummy connection patterns 331, and the cutting portion 121 in the decomposed layout 301, which includes laterally expanding the first connection patterns 111, the first dummy connection patterns 331, and the cutting portion 121 along the another direction (the x-direction) to form a plurality of third connection patterns 111a, a plurality of third dummy connection patterns 331a, and at least one cutting modification portion 121a, thereby forming the modification layout 301a. preferably, the first connection patterns 111, the first dummy connection patterns 331, and the cutting portion 121 are proportionally enlarged to both sides in the another direction (x-direction), so that each of the third connection patterns 111a and each of the third dummy connection patterns 331a may therefore obtain an enlarged width W3, as shown in FIG. 12. On the other hand, the optical proximity correction process is performed through the computer set to process the second connection patterns 113, the second dummy connection patterns 333, and the counterpart cutting portion 123 in the decomposed layout 303, and which also includes laterally expanding the second connection patterns 113, the second dummy connection patterns 333, and the counterpart cutting portion 123 along the another direction (the x-direction) to form a plurality of fourth connection patterns 113a, a plurality of fourth dummy connection patterns 333a, and at least one counterpart cutting modification portion 123a, thereby forming the modification layout 303a. The second connection patterns 113, the second dummy connection patterns 333 and the counterpart cutting portion 123 are also proportionally enlarged to both sides in the another direction (x-direction), so that each of the fourth connection patterns 113a and each of the fourth dummy connection patterns 333a may obtain the enlarged width W3, as shown in FIG. 13. In one embodiment, the width W3 of each third connection pattern 111a or each fourth connection pattern 113a may be 1.5 to 3 times larger than the width W1 of each first connection pattern 111 or each second connection pattern 113, and the width of each third dummy connection pattern 331a or each fourth dummy connection pattern 333a may be 1.5 to 3 times larger than the width W1 of each first dummy connection pattern 331 or each second dummy connection pattern 333, but are not limited thereto.

Figure 14:
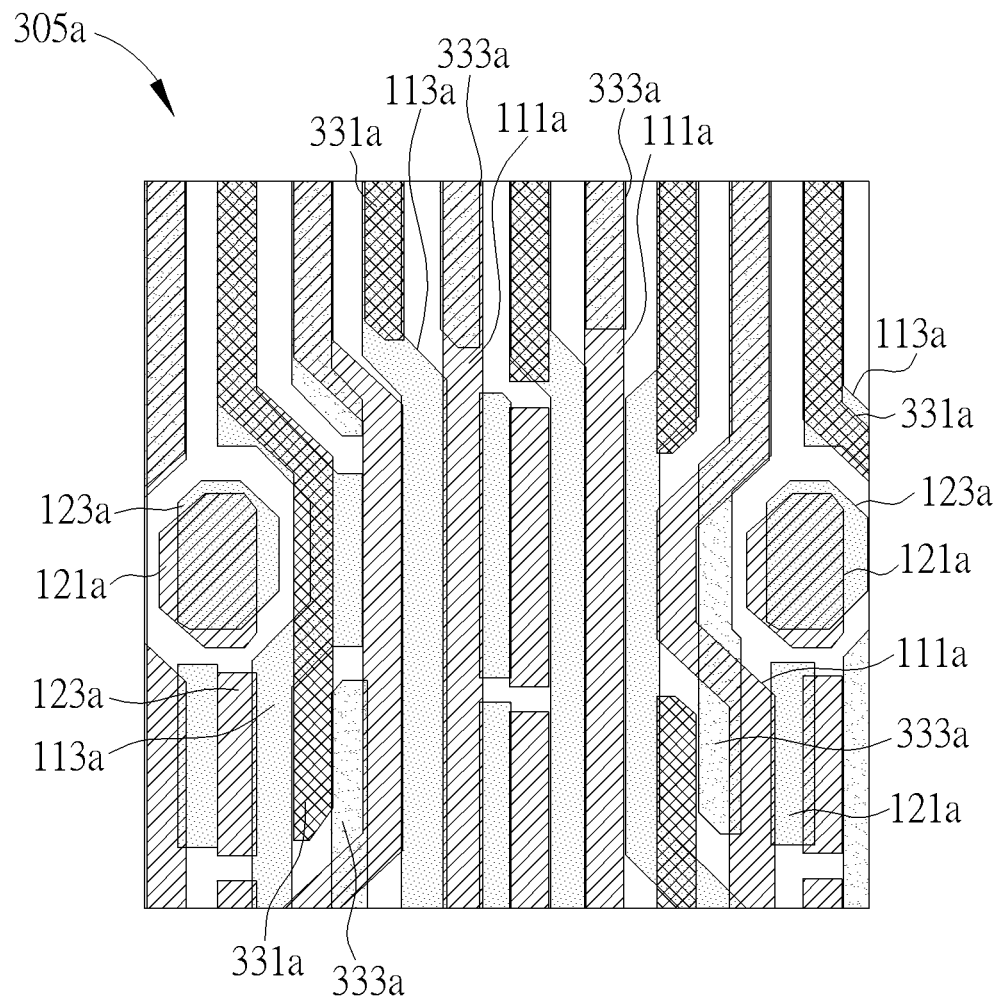

Following these, the third connection patterns 111a, the third dummy connection patterns 331a, and the cutting modification portion 121a in the modification layout 301a, and the fourth connection patterns 113a, the fourth dummy connection patterns 333a, and the counterpart cutting modification portion 123a are outputted by the computer set to format least one photomask (not shown in the drawings). Preferably, the third connection patterns 111a, the third dummy connection patterns 331a and the cutting modification portion 121a are outputted simultaneously to form a first photomask (not shown in the drawings), with the first photomask including patterns corresponding to the third connection patterns 111a, the third dummy connection patterns 331a, and the cutting modification portion 121a respectively, and the fourth connection patterns 113a, the fourth dummy connection patterns 333a, and the counterpart cutting modification portion 123a are outputted simultaneously to form a second photomask (not shown in the drawings), with the second photomask including patterns corresponding to the fourth connection patterns 113a, the fourth dummy connection patterns 333a and the counterpart cutting modification portion 123a. After that, photolithography processes are respectively performed through the first photomask and the second photomask, but is not limited thereto. Through these performances, the method of fabricating the semiconductor layout according to the another embodiment of the present disclosure is accomplished. It is noteworthy that, after performing the optical proximity correction process through the computer set, if the modification layout 301a and the modification layout 303a are further integrated into a modification layout 305 as shown in FIG. 14, the third connection patterns 111a and the fourth connection patterns 113a are still alternately arranged with each other, at least a portion of the third connection patterns 111a are partially overlapped with the fourth connection patterns 113a and/or the fourth dummy connection patterns 333a with the overlapping portion therebetween being about 10% to 50% of the area of the third connection patterns 111a, the fourth connection patterns 113a, or the fourth dummy connection patterns 333a, and at least a portion of the fourth connection patterns 113a are partially overlapped with the third dummy connection patterns 331a, with the overlapping portion therebetween being about 10% to 50% of the area of the fourth connection patterns 113a or the area of the third dummy connection patterns 331a. Furthermore, at least a portion of the third dummy connection patterns 331 may be partially overlapped with the fourth dummy connection patterns 333a, as shown in FIG. 14. On the other hand, the cutting modification portion 121a and the counterpart cutting modification portion 123a are still arranged between adjacent ones of the third connection patterns 111a and the fourth connection patterns 113a, and the cutting modification portion 121a is still partially overlapped with the counterpart cutting modification portion 123a. Meanwhile, at least a portion of the third connection patterns 111a is still partially overlapped with the counterpart cutting modification portion 123a, with the overlapping portion therebetween being about 10% to 50% of the area of the counterpart cutting modification portion 123a or the area of the third connection patterns 111a, at least a portion of the fourth connection patterns 113a is still partially overlapped with the cutting modification portion 121a, with the overlapping portion therebetween being about 10% to 50% of the area of the cutting modification portion 121a or the area of the fourth connection patterns 113a, as shown in FIG. 14. Accordingly, through the overlapped relationship between the third connection patterns 111a and the fourth connection patterns 113a, and between the third dummy connection patterns 331a and the fourth dummy connection patterns 333a, the method of the present embodiment may improve the possible issues such as light diffraction or poor photolithography caused by the connection patterns 110 in the layout 100 with dimensions and/or pitches that violates the predetermined rule of photolithography. Particularly, through the partial overlapped relationship between the fourth connection patterns 113a and the third dummy connection patterns 331, and between the third connection patterns 111a and the fourth dummy connection patterns 333a, the method of the present embodiment may compensate the patterns and contours of the fourth connection patterns 113a and the third connection patterns 111a, so as to improve the patterns and contours of the first photomask and the second photomask formed by outputting the modification layout 301a and the modification layout 303a. Thus, the quality of the photomasks may be significantly improved.

According to the method of the present embodiment, the layout 100 is firstly decomposed to enlarge the pitches between the connection patterns of the layout 100, thereby forming the decomposed layouts 101, 103. Next, dummy connection patterns are disposed in the decomposed layout 101, 103, to form the decomposed layouts 301, 303. Then, the optical proximity correction technique is performed on the first connection patterns 111, the first dummy connection patterns 331, the second connection patterns 113, the second dummy connection patterns 333, the cutting portion 121 and the counterpart cutting portion 123 in the decomposed layouts 301, 303, to laterally expand the width of the aforementioned patterns, so that, the connection patterns 110 in the layout 100 with dimensions and/or pitches that violates the predetermined rule of photolithography may at least partially overlapped with each other, to form the third connection patterns 111a and the fourth connection patterns 113a at least partially overlapped with each other and/or the third dummy connection patterns 331a and the fourth dummy connection patterns 333a at least partially overlapped with each other. With these arrangements, through the third connection patterns 111a with at least a portion thereof being partially overlapped with the fourth connection patterns 113a and/or the third dummy connection patterns 331a with at least a portion thereof being partially overlapped with the fourth dummy connection patterns 333a may effectively improve the technical problems such as process defects or inaccurate pattern contours caused by the connections patterns 110 in the layout 100 with dimensions and/or pitches that violates the predetermined rule of photolithography, and the photomask with more accurate patterns and contours may be successfully formed based on the layout 100 under the method of the present embodiment. Thus, the method of the present embodiment enables to optimize the quality of the photomask, and then, the connection patterns 110 of the layout 100 may be effectively and faithfully transferred to a semiconductor wafer through the photolithography process in the present embodiment.

Overall speaking, the method of fabricating the semiconductor layout and the method of fabricating the semiconductor structure in the present disclosure use the optical proximity correction process to modify the connection patterns, and, the photomask formed by outputting the layout may therefore obtain more accurate patterns and contours. With these arrangements, the semiconductor structure formed through the photomask may significantly improve the reliability of the electrically connection between the metal lines and the conductive pads through a simplified process flow without additionally photolithography step, even when the dimensions and the pitches of the connection patterns which are adjacent with each other, or the dimensions and the pitches of the connection patterns and the to-be split pattern which are adjacent with each other, violate the predetermined rule of photolithography.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor layout, comprising:
    providing a layout, the layout comprising a plurality of connection patterns separately arranged with each other;
    decomposing the connection patterns to a plurality of first connection patterns and a plurality of second connection patterns alternatively arranged with each other;
    forming a plurality of first dummy connection patterns separately arranged with each other, wherein the first dummy connection patterns are arranged between any two adjacent ones of the first connection patterns, and the first dummy connection patterns are not overlapped with the first connection patterns;
    forming a plurality of second dummy connection patterns separately arranged with each other, wherein the second dummy connection patterns are arranged between any two adjacent ones of the second connection patterns, and the second dummy connection patterns are not overlapped with the second connection patterns, wherein the first dummy connection patterns are overlapped with the second dummy connection patterns;
    performing an optical proximity correction process on the first connection patterns and the second connection patterns through a computer set, to form a plurality of third connection patterns and a plurality of fourth connection patterns, wherein at least a portion of the third connection patterns is overlapped with the fourth connection patterns; and
    outputting the third connection patterns and the fourth connection patterns to form photomasks.

2. The method of fabricating the semiconductor layout according to claim 1, performing the optical proximity correction process comprising:
    laterally expanding the first connection patterns and the second connection patterns.

3. The method of fabricating the semiconductor layout according to claim 1, further comprising:
    performing the optical proximity correction process on the first dummy connection patterns and the second dummy connection patterns to form a plurality of third dummy connection patterns and a plurality of fourth dummy connection patterns, wherein at least a portion of the third dummy connection patterns is overlapped with the fourth dummy connection patterns;
    outputting the third dummy connection patterns and the third connection patterns to form a first photomask; and
    outputting the fourth dummy connection patterns and the fourth connection patterns to form a second photomask.

4. The method of fabricating the semiconductor layout according to claim 3, wherein at least a portion of the third dummy connection patterns is overlapped with the fourth connection patterns.

5. The method of fabricating the semiconductor layout according to claim 3, wherein at least a portion of the fourth dummy connection patterns is overlapped with the third connection patterns.

6. The method of fabricating the semiconductor layout according to claim 3, further comprising:
    transferring the first photomask and the second photomask into a target layer, to form a plurality of first patterns and a plurality of second patterns respectively, wherein the first patterns are not overlapped with the second patterns.

7. The method of fabricating the semiconductor layout according to claim 1, wherein the layout comprises at least one to-be-split pattern, and the to-be-split pattern is disposed between two adjacent ones of the first connection patterns and the second connections patterns.

8. The method of fabricating the semiconductor layout according to claim 7, further comprising:
    splitting the to-be-split pattern into a cutting portion and a counterpart cutting portion; and
    performing the optical proximity correction process on the cutting portion and the counterpart cutting portion, to form a cutting modification portion and a counterpart cutting modification portion, wherein the cutting modification portion is partially overlapped with the counterpart cutting modification portion.

9. The method of fabricating the semiconductor layout according to claim 7, wherein the cutting modification portion is partially overlapped with the fourth connection patterns, and the counterpart cutting modification portion is partially overlapped with the third connection patterns.

10. A method of fabricating a semiconductor structure, comprising:
    providing a layout, the layout comprising a plurality of connection patterns separately arranged with each other;
    decomposing the layout to a plurality of first connection patterns and a plurality of second connection patterns alternatively arranged with each other;
    forming a plurality of first dummy connection patterns separately arranged with each other, wherein the first dummy connection patterns are arranged between any two adjacent ones of the first connection patterns, and the first dummy connection patterns are not overlapped with the first connection patterns;
    forming a plurality of second dummy connection patterns separately arranged with each other, wherein the second dummy connection patterns are arranged between any two adjacent ones of the second connection patterns, and the second dummy connection patterns are not overlapped with the second connection patterns;

performing an optical proximity correction process on the first connection patterns and the second connection patterns and on the first dummy connection patterns and the second dummy connection patterns through a computer set, to form a plurality of third connection patterns and a plurality of fourth connection patterns and to form a plurality of third dummy connection patterns and a plurality of fourth dummy connection patterns, wherein at least a portion of the third connection patterns is overlapped with the fourth connection patterns, and at least a portion of the third dummy connection patterns is overlapped with the fourth dummy connection patterns;

outputting the third dummy connection patterns and the third connection patterns to form a first photomask, and outputting the fourth dummy connection patterns and the fourth connection patterns to form a second photomask; and transferring the first photomask and the second photomask into a target layer to from a plurality of first patterns and a plurality of second patterns respectively, wherein the first patterns are not overlapped with the second patterns.

11. The method of fabricating the semiconductor structure according to claim 10, performing the optical proximity correction process comprising:

laterally expanding the first connection patterns and the second connection patterns.

12. The method of fabricating the semiconductor structure according to claim 10, wherein at least a portion of the third dummy connection patterns is overlapped with the fourth connection patterns.

13. The method of fabricating the semiconductor structure according to claim 10, wherein at least a portion of the fourth dummy connection patterns is overlapped with the third connection patterns.

14. The method of fabricating the semiconductor structure according to claim 10, wherein the layout further comprises at least one to-be-split pattern, and the to-be-split pattern is disposed between two adjacent ones of the first connection patterns and the second connections patterns.

15. The method of fabricating the semiconductor structure according to claim 14, further comprising:

splitting the to-be-split pattern into a cutting portion and a counterpart cutting portion; and performing the optical proximity correction process on the cutting portion and the counterpart cutting portion, to form a cutting modification portion and a counterpart cutting modification portion, wherein the cutting modification portion is partially overlapped with the counterpart cutting modification portion.

* * * * *